(12) United States Patent
Shirane et al.

(10) Patent No.: US 10,340,865 B2
(45) Date of Patent: Jul. 2, 2019

(54) AMPLIFIER

(71) Applicants: Kabushiki Kaisha Toshiba, Minato-ku, Tokyo (JP); Toshiba Electronic Devices & Storage Corporation, Minato-ku, Tokyo (JP)

(72) Inventors: Atsushi Shirane, Kawasaki Kanagawa (JP); Rui Ito, Chigasaki Kanagawa (JP); Toshiya Mitomo, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/106,963

(22) Filed: Aug. 21, 2018

(65) Prior Publication Data

US 2018/0358940 A1    Dec. 13, 2018

Related U.S. Application Data

(63) Continuation of application No. 15/700,521, filed on Sep. 11, 2017, now Pat. No. 10,084,419.

(30) Foreign Application Priority Data

Mar. 23, 2017  (JP) .................................. 2017-057305

(51) Int. Cl.
  *H03F 3/45*     (2006.01)
  *H03F 3/345*    (2006.01)
  (Continued)

(52) U.S. Cl.
  CPC ............. *H03F 3/345* (2013.01); *H03F 1/303* (2013.01); *H03F 1/3211* (2013.01); *H03F 3/16* (2013.01);
  (Continued)

(58) Field of Classification Search
  CPC ........ H03F 3/345; H03F 3/16; H03F 3/45183; H03F 1/303; H03F 1/3211;
  (Continued)

(56) References Cited

U.S. PATENT DOCUMENTS 5,677,646 A    10/1997  Entrikin
6,586,996 B2   7/2003   Fanous et al.
(Continued)

FOREIGN PATENT DOCUMENTS

JP   2000-510656 A   8/2000
JP   2012-100224 A   5/2012
(Continued)

*Primary Examiner* — Khanh V Nguyen
(74) *Attorney, Agent, or Firm* — White & Case LLP

(57) ABSTRACT

An amplifier of an embodiment includes: a plurality of input transistors of a plurality of differential pairs; a plurality of first resistance circuits mutually connecting respective sources of the input transistors corresponding to the differential pairs and mutually connecting the respective sources and reference potential points; a plurality of second resistance circuits being connected between the respective sources of the plurality of input transistors and the reference potential points, respectively; and a control circuit configured to generate a control signal controlling whether or not to electrically connect the plurality of first resistance circuits and the plurality of second resistance circuits to the respective sources of the input transistors.

5 Claims, 6 Drawing Sheets

(51) Int. Cl.
*H03F 1/32* (2006.01)
*H03F 1/30* (2006.01)
*H03F 3/16* (2006.01)
*H03G 1/00* (2006.01)

(52) U.S. Cl.
CPC ..... *H03F 3/45179* (2013.01); *H03F 3/45183* (2013.01); *H03F 3/45197* (2013.01); *H03G 1/0029* (2013.01); *H03G 1/0088* (2013.01); *H03F 2203/45352* (2013.01); *H03G 1/0023* (2013.01)

(58) Field of Classification Search
CPC .... H03F 3/45179; H03F 3/45; H03F 3/45188; H03F 3/45192; H03F 2200/177; H03G 1/0088; H03G 1/0023; H03G 1/0029; H03G 1/0035; H03G 3/00; H03G 2201/10
USPC .................................................. 330/253, 254
See application file for complete search history.

(56) References Cited

U.S. PATENT DOCUMENTS

| | | | |
|---|---|---|---|
| 7,019,592 B2 | 3/2006 | Jaussi | |
| 7,944,298 B2 | 5/2011 | Cabanillas et al. | |
| 8,446,980 B2 | 5/2013 | Ashita | |
| 8,604,877 B2* | 12/2013 | Chang | H03F 3/45197 330/253 |
| 9,013,236 B2* | 4/2015 | Lee | H03F 3/45179 330/253 |
| 9,306,509 B2 | 4/2016 | Lim et al. | |
| 2005/0195033 A1 | 9/2005 | Sakurai | |

FOREIGN PATENT DOCUMENTS

| | | |
|---|---|---|
| JP | 5389818 B2 | 1/2014 |
| JP | 5938147 B2 | 6/2016 |
| WO | 2009-145283 A1 | 12/2009 |

\* cited by examiner

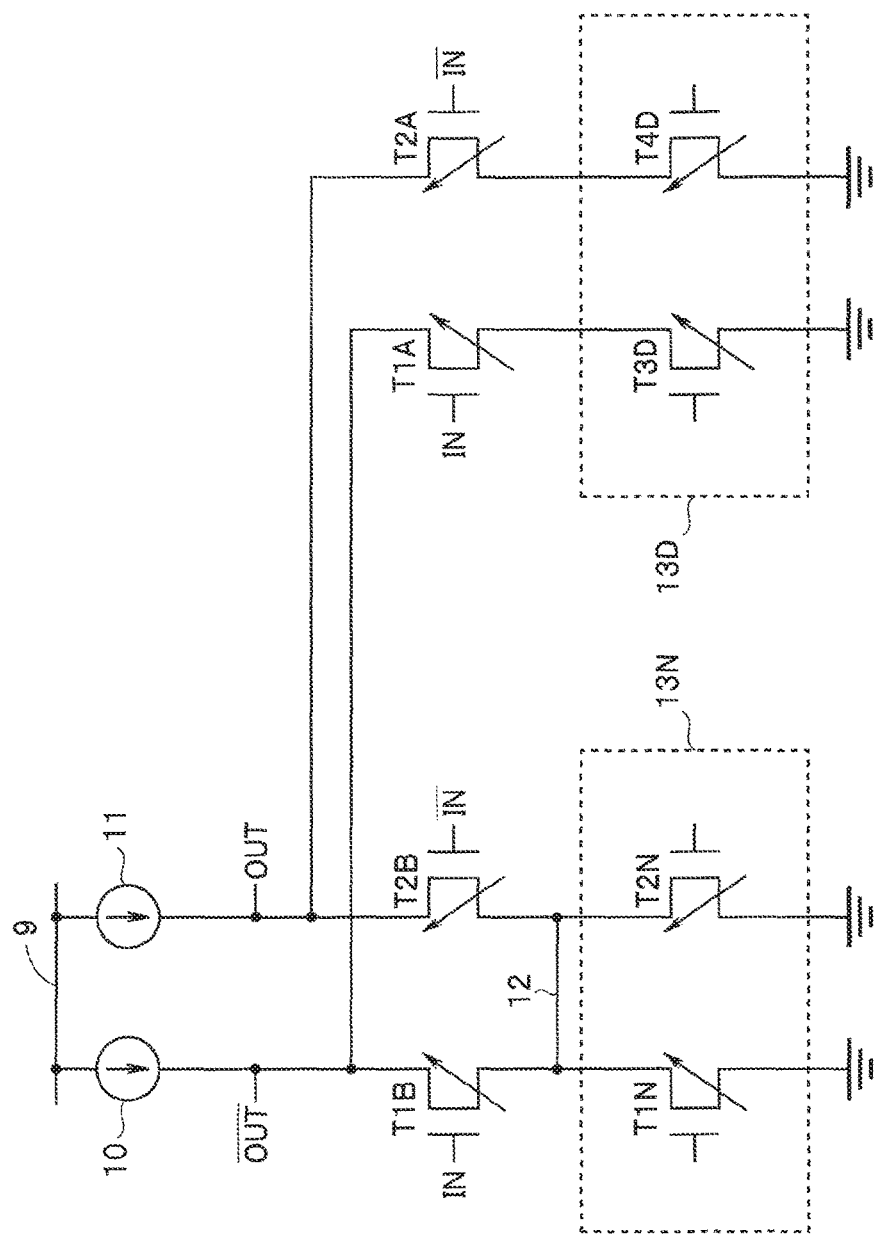

FIG. 4

| a1 | a2 | a3 | AMOUNT OF DEGENERATION |
|---|---|---|---|
| 1 | 1 | 1 | 0 |
| 0 | 1 | 1 | 1 |
| 1 | 0 | 1 | 2 |
| 0 | 0 | 1 | 3 |
| 1 | 1 | 0 | 4 |
| 0 | 1 | 0 | 5 |
| 1 | 0 | 0 | 6 |
| 0 | 0 | 0 | 7 |

FIG. 5

| Tr SIZE OF LINEARITY IMPROVING TRANSISTOR CIRCUIT | Tr SIZE OF OPERATING POINT ADJUSTING TRANSISTOR CIRCUIT |
|---|---|
| 0 | 7K |
| 1K | 6K |
| 2K | 5K |
| 3K | 4K |
| 4K | 3K |
| 5K | 2K |
| 6K | K |
| 7K | 0 |

AMPLIFIER

CROSS-REFERENCE TO RELATED APPLICATION

This application is a continuation of application Ser. No. 15/700,521, filed Sep. 11, 2017 and is based upon and claims the benefit of priority from the prior Japanese Patent Application No. 2017-057305, filed on Mar. 23, 2017; the entire contents of each which are incorporated herein by reference.

FIELD

An embodiment described herein relates generally to an amplifier.

BACKGROUND

Conventionally, a degeneration technique may be adopted as a method for improving linearity of an amplifier. For example, in an amplifier using a source-grounded transistor, linearity can be improved by a degeneration resistance. The degeneration technique, however, has a nature of improving linearity as well as decreasing gain. Therefore, in a case of increasing a variable range of gain of the amplifier, it may be necessary to adjust a degree of reducing nonlinear distortion (an amount of degeneration).

However, when a resistance value of a degeneration resistance is changed, a DC operating point may change. Further, it is not possible to cause the amount of degeneration to be 0, and it is not possible to sufficiently increase the variable range of gain of the amplifier. Further, in a case of using an on-resistance of the transistor as the degeneration resistance, it is necessary to provide a transistor with a large transistor size in order to sufficiently increase the variable range of gain of the amplifier, and there is a problem from a viewpoint of chip size and a view point of characteristics accompanying parasitic capacitance.

BRIEF DESCRIPTION OF THE DRAWINGS

FIG. 3 is an explanatory diagram for illustrating a method for adjusting an amount of degeneration in the present embodiment;

FIG. 4 is a table showing a relationship between control signals a1 to a3 and the amount of degeneration;

FIG. 5 is a table showing a relationship between a sum of gate widths of respective transistors of a linearity improving transistor circuit 21D (Tr size) and a sum of gate widths of respective transistors of an operating point adjusting transistor circuit 21N (Tr size);

DETAILED DESCRIPTION

An amplifier of an embodiment includes: a plurality of input transistors of a plurality of differential pairs, drains of the plurality of input transistors being connected to current sources, and input signals being inputted to gates of the plurality of input transistors; a plurality of first resistance circuits having a switching function, the plurality of first resistance circuits being connected between respective sources of the plurality of input transistors and reference potential points, respectively, and first resistance circuits corresponding to each of the differential pairs of input transistors being mutually connected at points of connection with the sources of the input transistors, a plurality of second resistance circuits having the switching function, the plurality of second resistance circuits being connected between the respective sources of the plurality of input transistors and the reference potential points, respectively; and a control circuit configured to change a linearity improvement effect while controlling an operating point, by generating a control signal controlling whether or not to electrically connect the plurality of first resistance circuits and the plurality of second resistance circuits to the respective sources of the input transistors.

An embodiment of the present invention will be described in detail below with reference to drawings.

Figure 1:
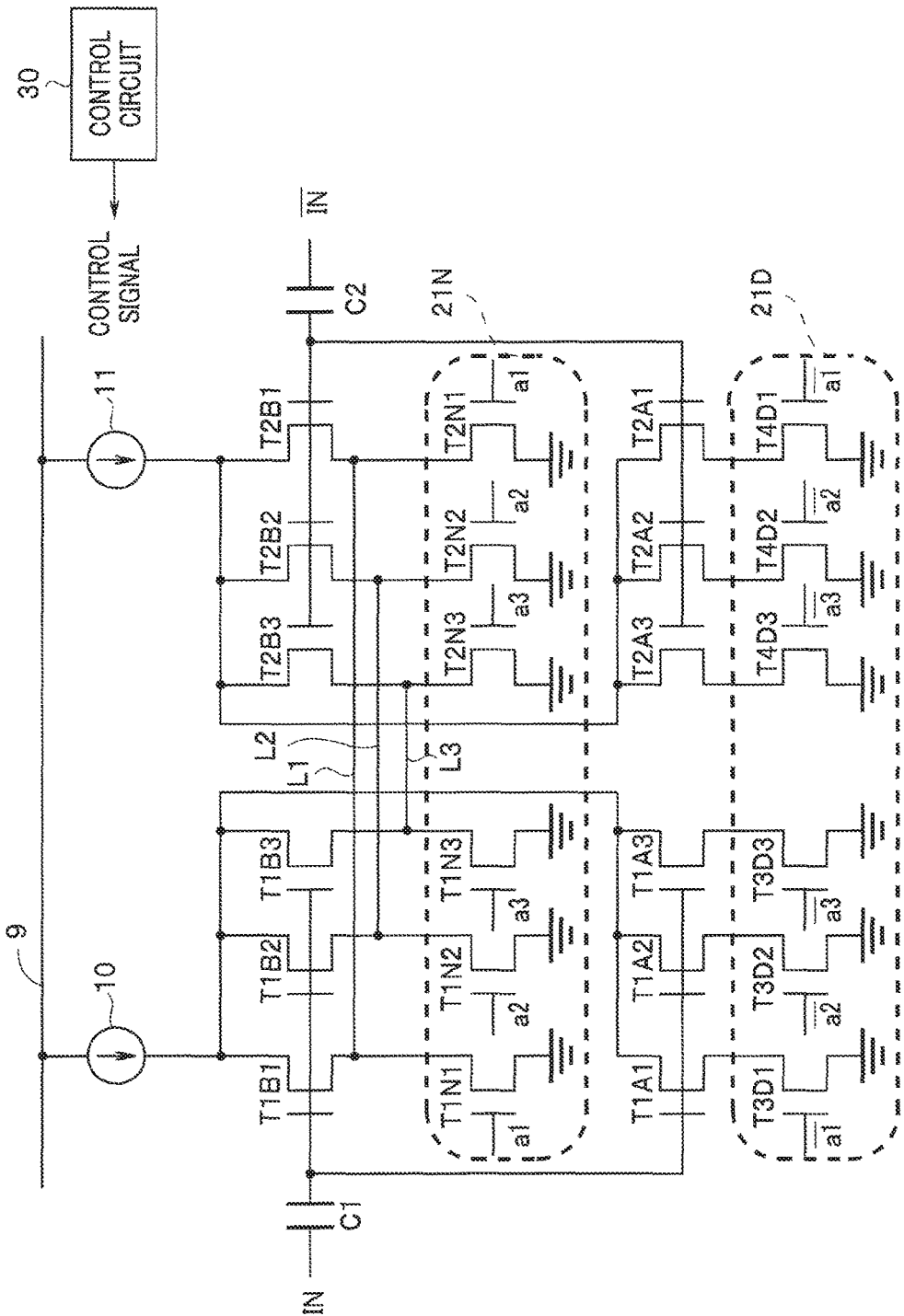
FIG. 1 is a circuit diagram showing an amplifier according to an embodiment of the present invention.

FIG. 1 is a circuit diagram showing an amplifier according to the embodiment of the present invention. Further, FIGS. 2A and 2B are circuit diagrams showing amplifiers according to related techniques.

First, a variable range of an amount of degeneration will be described with reference to FIGS. 2A and 2B.

Figure 2A:
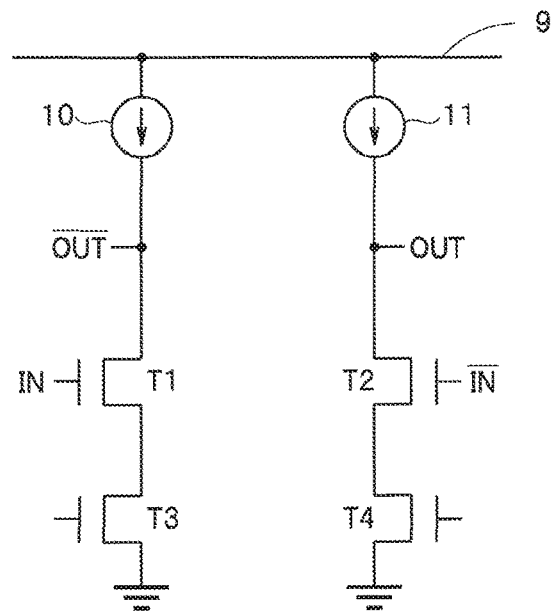
FIG. 2A is a circuit diagram showing an amplifier according to a related technique.
Figure 2B:
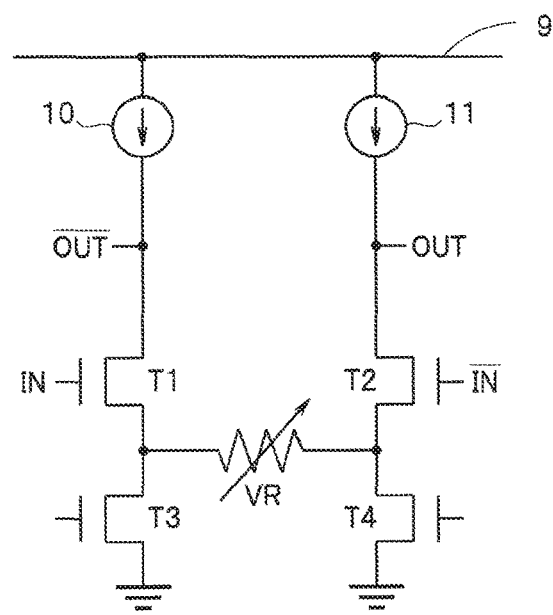
FIG. 2B is a circuit diagram showing an amplifier according to a related technique.

FIGS. 2A and 2B show amplifiers in a differential configuration. FIG. 2A shows an amplifier corresponding to an in-phase input, and FIG. 2B shows an amplifier corresponding to a differential input.

The amplifier of FIG. 2A is configured with input transistors T1 and T2 constituting a differential pair. Current sources 10 and 11 are connected to a power source line 9. A current is supplied to a drain of the transistor T1 from the current source 10, and a current is supplied to a drain of the transistor T2 from the current source 11. A source of the transistor T1 is connected to a reference potential point via a drain-source path of a transistor T3. Further, a source of the transistor T2 is connected to a reference potential point via a drain-source path of a transistor T4.

To gates of the transistors T1 and T2, in-phase inputs IN and /IN ("/" is indicated by a bar in the figures) are given. A negative phase output is outputted from the drain of the transistor T1, and a positive phase output is outputted from the drain of the transistor T2.

The transistors T3 and T4 are degeneration resistances for the transistors T1 and T2, respectively. When the circuit in FIG. 2A functions as an in-phase input amplifier, the transistors T3 and T4 function as degeneration resistances, and the amount of degeneration changes according to on-resistance of the transistors T3 and T4. Thereby, nonlinearity of the amplifier is improved.

When, for example, a plurality of transistors are adopted instead of each of the transistors T3 and T4, and a transistor circuit in which on-resistance is variable by selectively turning on the transistors is adopted, it is possible to change a degree of reducing nonlinear distortion (the amount of degeneration). In this case, however, an operating point changes accompanying change in the on-resistance, and an amplification factor also changes.

Moreover, it is not possible to cause the on-resistance to be 0 by the above configuration, and it may not be possible to sufficiently increase a variable range of the amplification factor. Further, it is necessary to increase a transistor size in order to sufficiently minimize the on-resistance, which causes increase in a chip area.

On the other hand, in the amplifier of FIG. 2B, a variable resistance VR is connected between the sources of the input transistors T1 and T2 constituting a differential pair. When the circuit in FIG. 2B functions as a differential phase input amplifier, the variable resistance VR functions as a degeneration resistance, and nonlinearity of the amplifier is improved according to a resistance value of the variable resistance VR.

However, it is sometimes not possible to cause the resistance value of the variable resistance VR to be 0, and it may not be possible to sufficiently increase the variable range of the amplification factor.

Therefore, in the present embodiment, a linearity improving transistor circuit which causes the amount of degeneration to be variable by switching among a plurality of transistors is provided as a degeneration resistance of input transistors constituting a differential pair, and an operating point adjusting transistor circuit for connecting the input transistors and causing an operating point to be constant is provided.

(Method for Adjusting Amount of Degeneration)

FIG. 3 is an explanatory diagram for illustrating a method for adjusting the amount of degeneration in the present embodiment and shows a schematic configuration of the amplifier in FIG. 1.

In the example of FIG. 3, two transistors T1A and T1B corresponding to the input transistor T1 in FIGS. 2A and 2B are adopted, and two transistors T2A and T2B corresponding to the input transistor T2 are adopted.

An arrow attached to each transistor symbol in FIG. 3 indicates that a transistor size of each transistor is variable. For example, by configuring each transistor with a plurality of transistors the drain-source paths of which are connected in parallel and making it possible to appropriately change transistors to be operated, the transistor size (a gate width) can be substantially adjusted.

Further, a source of the positive phase input transistor T1A is connected to a reference potential point via a drain-source path of a transistor T3D constituting a degeneration resistance, and a source of the negative phase input transistor T2A is connected to a reference potential point via a drain-source path of a transistor T4D constituting a degeneration resistance. Transistor sizes of the transistors T3D and T4D are variable. By the transistor sizes of the transistors T3D and T4D being changed, the amount of degeneration can be changed.

That is, a transistor circuit by the transistors T3D and T4D constitute a linearity improving transistor circuit 13D as a linearity improving circuit which contributes to change in the amount of degeneration.

However, when the transistor sizes of the transistors T3D and T4D are simply changed, on-resistance also changes, and a DC operating point changes. Therefore, in the present embodiment, in order to keep the operating point constant, an operating point adjusting transistor circuit 13N as an operating point adjusting circuit is provided.

A source of the positive phase input transistor T1B is connected to a reference potential point via a drain-source path of a transistor T1N which does not contribute to degeneration, and a source of a negative phase input transistor T2B is connected to a reference potential point via a drain-source path of a transistor T2N which does not contribute to degeneration. Transistor sizes of the transistors T1N and T2N are variable.

Further, in the present embodiment, the sources of the input transistors T1B and T2B are connected via wiring 12. By the wiring 12, the resistance value of the variable resistance VR in FIG. 2B becomes equivalent to 0, and the amount of degeneration by the wiring 12 is 0. Therefore, the amount of degeneration in the circuit in FIG. 3 is decided by the linearity improving transistor circuit 13D when a differential input is considered.

In the present embodiment, gate width adjustment is performed so that a sum of respective gate widths of the positive phase input transistors T1A and T1B (=a sum of respective gate widths of the negative phase input transistors T2A and T2B) becomes constant, and a sum of respective gate widths of the transistors T3D and T1N (=a sum of respective gate widths of the transistors T4D and T2N) becomes constant.

For example, it is assumed that the gate widths of the transistors T1A and T3D (=the gate widths of the transistors T2A and T4D) can be controlled by four levels. In this case, as for the gate widths of the transistors T1B and T1N (=the gate widths of the transistors T2B and T2N) also, the gate widths are similarly configured to be controlled by four levels.

When the gate widths of the transistors T1A and T3D (=the gate widths of the transistors T2A and T4D) are controlled to be 0, 1k, 2k and 3k (k is a predetermined value), the gate widths of the transistors T1B and T1N (=the gate widths of the transistors T2B and T2N) are controlled to be 3k, 2k, 1k and 0. In this case, a total gate width of the transistors T3D and T1N (=a total gate width of the transistors T4D and T2N) is always 3k, and the on-resistance becomes constant. Further, it is also possible to adjust the amount of degeneration by changing the gate width of each transistor of the linearity improving transistor circuit 13D. Moreover, it is possible to, by turning off all of the respective transistors of the linearity improving transistor circuit 13D, cause the amount of degeneration to be 0 and cause gain of the amplifier to be maximum.

(Specific Circuit)

In FIG. 1, the current sources 10 and 11 are connected to the power source line 9. The current sources 10 and 11 generate constant currents. The current source 10 can supply a constant current to drains of positive phase input transistors T1A1, T1A2 and T1A3 corresponding to the transistor T1A in FIG. 3, and transistors T1B1, T1B2 and T1B3 corresponding to the transistor T1B. Further, the current source 11 can supply a constant current to drains of negative phase input transistors T2A1, T2A2 and T2A3 corresponding to the transistor T2A in FIG. 3, and transistors T2B1, T2B2 and T2B3 corresponding to the transistor T2B.

Respective sources of the positive phase input transistors T1A1 and T1A2 and T1A3 are connected to reference potential points via drain-source paths of the transistors T3D1, T3D2 and T3D3 constituting degeneration resistances, respectively. Further, respective sources of the negative phase input transistors T2A1, T2A2 and T2A3 are connected to reference potential points via drain-source paths of the transistors T4D1, T4D2 and T4D3 constituting degeneration resistances, respectively. A linearity improving transistor circuit 21D is configured with the transistors T3D1, T3D2. T3D3, T4D1, T4D2 and T4D3 (hereinafter also generically referred to as transistors TD).

Respective sources of the positive phase input transistors T1B1, T1B2 and T1B3 are connected to reference potential points via drain-source paths of the transistors T1N1, T1N2 and T1N3 which do not contribute to degeneration, respectively. Further, respective sources of the negative phase input transistors T2B1, T2B2 and T2B3 are connected to reference potential points via drain-source paths of the transistors T2N1, T2N2 and T2N3 which do not contribute to source degeneration, respectively. An operating point adjusting transistor circuit 21N is configured with the transistors T1N1, T1N2, T1N3, T2N1, T2N2 and T2N3 (hereinafter also generically referred to as transistors TN).

In the present embodiment, respective gate widths of the transistors T1N1, T2N1, T3D1 and T4D1 are mutually same; respective gate widths of the transistors T1N2, T2N2, T3D2 and T4D2 are mutually same; and respective gate widths of the transistors T1N3, T2N3, T3D3 and T4D3 are mutually same.

Further, gate widths of the transistors T1A1, T2A1. T1B1 and T2B1 are mutually same; gate widths of the transistors T1A2, T2A2, T1B2 and T2B2 are mutually same; and gate widths of the transistors T1A3, T2A3, T1B3 and T2B3 are mutually same.

The sources of the transistors T1B1 and T2B1 constituting a differential pair are connected via wiring L1. Further, the sources of the transistors T1B2 and T2B2 are connected via wiring L2, and the sources of the transistors T1B3 and T2B3 are connected via wiring L3.

A positive phase input signal IN is inputted to gates of the positive phase input transistors T1A1 to T1A3, and T1B1 to T1B3 via a capacitor C1. Further, a negative phase input signal /IN ("/" is indicated by a bar in figures) is inputted to gates of the negative phase input transistors T2A1 to T2A3, and T2B1 to T2B3.

In the present embodiment, a control circuit 30 for controlling the linearity improving transistor circuit 21D and the operating point adjusting transistor circuit 21N is provided. The control circuit 30 generates control signals a1 to a3, and inverted control signals /a1 ("/" is indicated by a bar in figures) to /a3 ("l" is indicated by a bar in figures) of the control signals a1 to a3, respectively.

The control signal a1 is supplied to gates of the transistors T1N1 and T2N1 in the operating point adjusting transistor circuit 21N, and the inverted control signal /a1 is supplied to gates of transistors T3D1 and T4D1 in the linearity improving transistor circuit 21D. The control signal a2 is supplied to gates of the transistors T1N2 and T2N2, and the inverted control signal /a2 is supplied to gates of the transistors T3D2 and T4D2. The control signal a3 is supplied to gates of the transistors T1N3 and T2N3, and the inverted control signal /a3 is supplied to gates of the transistors T3D3 and T4D3.

The control signals a1 to a3 are high-level (hereinafter referred to as H-level) or low-level (hereinafter referred to as L-level) signals. Therefore, the transistors T3D1 and T4D1 are off when the transistors T1N1 and T2N1 are on, and the transistors T3D1 and T4D1 are on when the transistors T1N1 and T2N1 are off.

Further, as for the transistors T1N2 and T2N2 and the transistors T3D2 and T4D2, the former transistors are on when the latter transistors are off, and the former transistors are off when the latter transistors are on. Similarly, as for the transistors T1N3 and T2N3 and the transistors T3D3 and T4D3, the former transistors are on when the latter transistors are off, and the former transistors are off when the latter transistors are on.

Figure 6A:
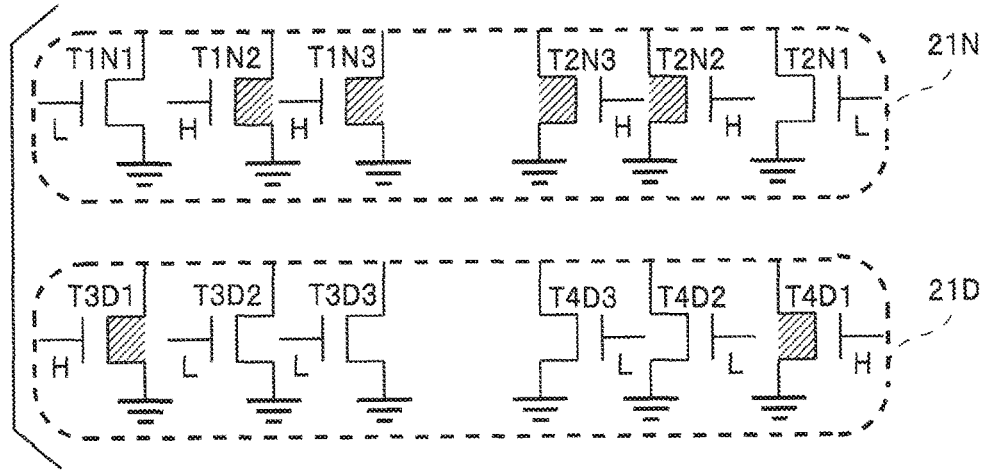
FIG. 6A is an explanatory diagram for illustrating an operation of the embodiment.
Figure 6B:
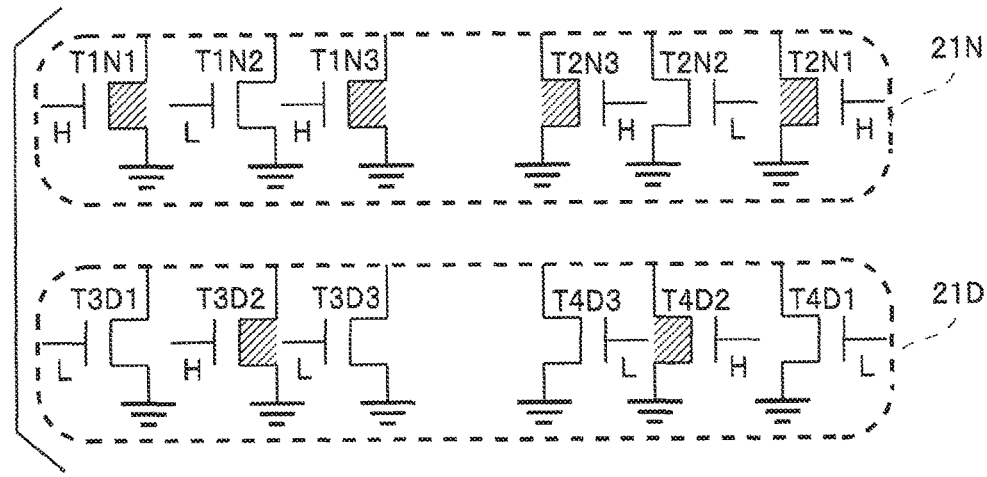
FIG. 6B is an explanatory diagram for illustrating an operation of the embodiment.
Figure 6C:
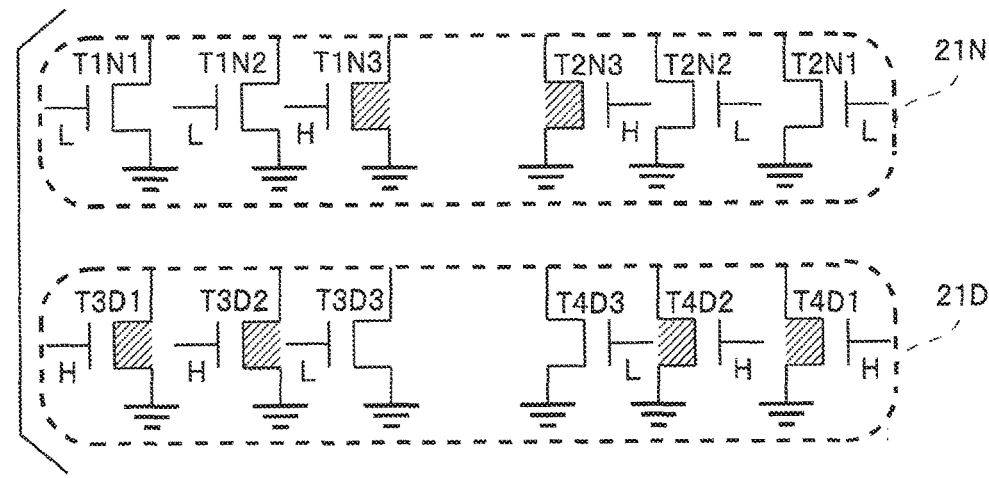
FIG. 6C is an explanatory diagram for illustrating an operation of the embodiment.

Next, an operation of the embodiment configured as described above will be described with reference to FIGS. 4 to 8. FIG. 4 is a table showing a relationship between the control signals a1 to a3 and the amount of degeneration. FIG. 5 is a table showing a relationship between a sum of the gate widths of the respective transistors of the linearity improving transistor circuit 21D (Tr size) and a sum of the gate widths of the respective transistors of the operating point adjusting transistor circuit 21N (Tr size). Further, FIGS. 6A to 6C are explanatory diagrams showing on and off states of the respective transistors of the linearity improving transistor circuit 21D and the respective transistors of the operating point adjusting transistor circuit 21N by whether being hatched or not.

FIGS. 4 and 5 show examples in which a ratio among the gate width of each of the transistors T1N 1, T2N 1, T3D1 and T4D1 (hereinafter referred to as transistors Ta1 when the transistors are not distinguished from one another), the gate width of each of the transistors T1N2, T2N2, T3D2 and T4D2 (hereinafter referred to as transistors Ta2 when the transistors are not distinguished from one another), and the gate width of each of the transistors T1N3, T2N3, T3D3 and T4D3 (hereinafter referred to as transistors Ta3 when the transistors are not distinguished from one another) is, for example, set to 1:2:4. For example, the gate widths of the transistors Ta1, Ta2 and Ta3 are assumed to be 1K, 2K and 4K (K is a predetermined value), respectively.

The wiring L1 connects the source of the transistor T1B and the source of the transistor T2B1. The wiring L2 connects the source of the transistor T1B2 and the source of the transistor T2B2. The wiring L3 connects the source of the transistor T1B3 and the source of the transistor T2B3. When a differential input is considered, the amount of degeneration by the wirings L1 to L3 is 0.

Now, it is assumed that the control circuit 30 generates the control signals a1 to a3 at the H level (a logical value 1) as shown in an uppermost row of FIG. 4. In this case, all the transistors TN of the operating point adjusting transistor circuit 21N are turned on, while all the transistors TD of the linearity improving transistor circuit 21D are off. Therefore, the amount of degeneration by each transistor TD of the linearity improving transistor circuit 21D is 0. Each transistor TN of the operating point adjusting transistor circuit 21N does not contribute to degeneration, and the amount of degeneration of the whole amplifier is 0. Therefore, in this case, the amplifier in FIG. 1 can obtain maximum gain.

Further, since all the transistors of the linearity improving transistor circuit 21D are off, the sum of the gate widths of the transistors can be thought to be 0. On the other hand, in this case, all the transistors of the operating point adjusting transistor circuit 21N are on, and the sum of the gate widths of the transistors is 7K as shown in an uppermost row of FIG. 5. Note that, the sum of the gate widths of the transistors shows the sum for the respective transistors each of which is one side of transistors of a differential pair.

Next, it is assumed that the control circuit 30 generates the control signal a1 at the L level (a logical value 0) and the control signals a2 and a3 at the H level (the logical value 1) as shown at the second row of FIG. 4. FIG. 6A shows the state. In this case, the transistors T3D1 and T4D1 of the linearity improving transistor circuit 21D are on as shown by hatching in FIG. 6A. Further, the transistors T3D2, T4D2, T3D3 and T4D3 are off. Therefore, in this case, the sum of the gate widths of the linearity improving transistor circuit 21D is 1K. On the other hand, the transistors T1N1 and T2N1 of the operating point adjusting transistor circuit 21N are off, and the transistors T1N2, T2N2, T1N3 and T2N3 are on (see FIG. 6A). Therefore, in this case, the sum of the gate widths of the operating point adjusting transistor circuit 21N is 6K (the second row of FIG. 5).

Next, it is assumed that the control circuit 30 generates the control signals a1 and a3 at the H level (the logical value 1) and the control signal a2 at the L level (the logical value 0) as shown at the third row of FIG. 4. FIG. 6B shows the state. In this case, the transistors T3D1, T4D1, T3D3 and T4D3 of the linearity improving transistor circuit 21D are off, and the transistors T3D2 and T4D2 are on. Therefore, in this case, the sum of the gate widths of the linearity improving transistor circuit 21D is 2K. On the other hand, the transistors T1N2 and T2N2 of the operating point adjusting transistor circuit 21N are off, and the transistors T1N1, T2N1, T1N3 and T2N3 are on. Therefore, in this case, the sum of the gate widths of the operating point adjusting transistor circuit 21N is 5K (the third row of FIG. 5).

Next, it is assumed that the control circuit 30 generates the control signals a1 and a2 at the L level (the logical value 0) and the control signal a3 at the H level (the logical value 1) as shown at the fourth row of FIG. 4. FIG. 6C shows the state. In this case, the transistors T3D1. T4D1, T3D2 and T4D2 of the linearity improving transistor circuit 21D are on, and the transistors T3D3 and T4D3 are off. Therefore, in this case, the sum of the gate widths of the linearity improving transistor circuit 21D is 3K. On the other hand, the transistors T1N1, T2N1, T1N2 and T2N2 of the operating point adjusting transistor circuit 21N are off, and the transistors T1N3 and T2N3 are on. Therefore, in this case, the sum of the gate widths of the operating point adjusting transistor circuit 21N is 4K (the fourth row of FIG. 5).

Thus, between the respective transistors TD of the linearity improving transistor circuit 21D and the respective transistors TN of the operating point adjusting transistor circuit 21N, one of two transistors vertically arranged in FIG. 1 is always on, and the other is always off even if the control signals a1 to a3 are changed. Therefore, as a result of the transistors being turned on, each of a sum of gate widths of transistors connected to the respective positive phase input transistors and a sum of gate widths of transistors connected to the respective negative phase input transistors is always 7K and is constant. Therefore, as shown in FIG. 5, the operating point remains constant independently from the control signals.

Further, the sum of the gate widths of the linearity improving transistor circuit 21D changes as shown in FIG. 5 by changing the control signals a1 to a3. Thereby, the amount of degeneration can be changed among eight levels by the control signals a1 to a3 as shown in FIG. 4. Moreover, in the present embodiment, it is also possible to cause the amount of degeneration to be 0.

Note that, though the amount of degeneration can be adjusted among the eight levels with equal intervals by a 3-bit control signal, by causing the ratio of the gate widths of the transistors Ta1, Ta2 and Ta3 to be 1:2:4, the ratio of the gate widths is not limited to 1:2:4.

Figure 7:
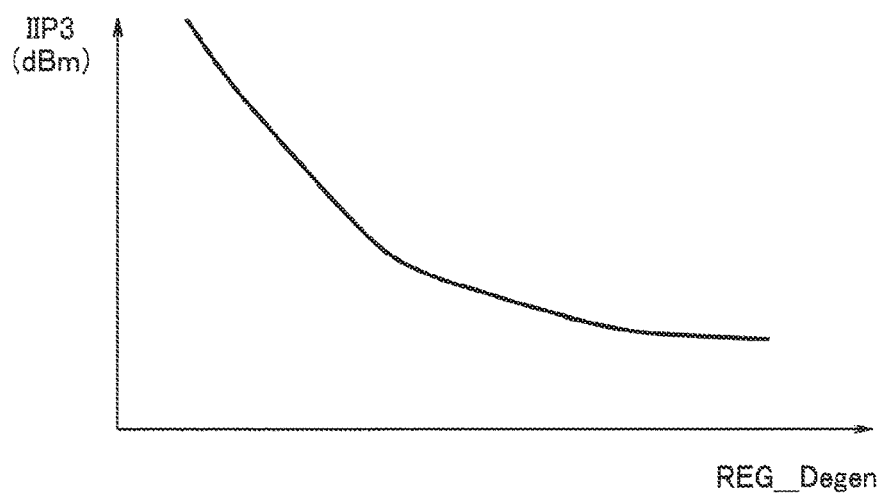
FIG. 7 is a graph showing change in the amount of degeneration in the embodiment.
Figure 8:
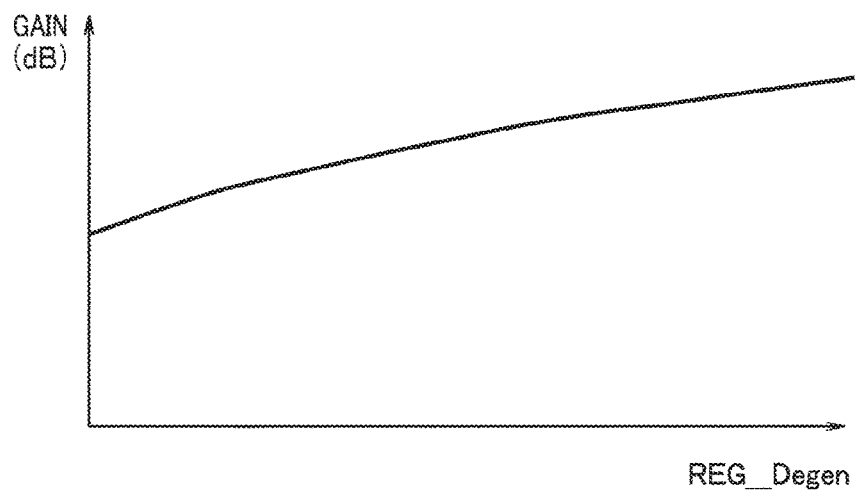
FIG. 8 is a graph showing change in gain in the embodiment.

FIG. 7 is a graph showing change in the amount of degeneration, with an index (REG-Degen) corresponding to the sum of gate widths of the operating point adjusting transistor circuit represented by a horizontal axis and with an IIP3 (an input-referred third-order intercept point) which is an index of linearity represented by a vertical axis. Further, FIG. 8 is a graph showing change in gain, with an index (REG-Degen) corresponding to the sum of gate widths of the operating point adjusting transistor circuit represented by a horizontal axis and with gain of an amplifier represented by a vertical axis.

As shown in FIG. 7, it is seen that, by decreasing the sum of the gate widths of the operating point adjusting transistor circuit 21N more and increasing the sum of the gate widths of the linearity improving transistor circuit 21D more, the linearity becomes more favorable. On the contrary, as shown in FIG. 8, it is seen that, by increasing the sum of the gate widths of the operating point adjusting transistor circuit 21N more and decreasing the gate widths of the linearity improving transistor circuit 21D more, the gain becomes larger.

As described above, in the present embodiment, a linearity improving transistor circuit is provided which is configured to cause the amount of degeneration to be variable by switching among a plurality of transistors, as a degeneration resistance of input transistors constituting a differential pair. Further, an operating point adjusting transistor circuit is provided which is for connecting sources of input transistors and causing an operating point to be constant by respective transistors of the operating point adjusting transistor circuit being turned on/off complementarily with the respective transistors of the linearity improving transistor circuit. Thereby, it is possible to change the amount of degeneration without changing the operating point, and it is possible to avoid the operating point from fluctuating at the time of controlling the amount of degeneration. Further, it is possible to, by turning off all the transistors of the linearity improving transistor circuit, cause the amount of degeneration to be 0 and maximize gain of an amplifier. In this case also, it is not necessary to use transistors with a large gate width, and it is possible to downsize the apparatus.

An example of using transistors as a degeneration resistance has been described in the above embodiment. However, a degeneration resistance which is configured with resistance circuits, each of which is configured with a resistance and a switch element, connected in parallel and the resistance value of which can be changed by performing on/off control of the switch elements by a control signal may be adopted.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An amplifier comprising:
   a pair of current sources;
   a plurality of first differential input transistors comprising:
      a first plurality of transistors having first ends connected to one of the pair of current sources, and control ends to which positive a phase input signal is inputted, and
      a second plurality of transistors respectively constituting differential pairs with the first plurality of transistors, the second plurality of transistors having first ends connected to the other of the pair of current sources, and control ends to which negative a phase input signal is inputted;
   a plurality of second differential input transistors comprising:

a third plurality of transistors having first ends connected to one of the pair of current sources, and control ends to which the positive phase input signal is inputted, and a fourth plurality of transistors respectively constituting differential pairs with the third first plurality of transistors, the fourth plurality of transistors having first ends connected to the other of the pair of current sources, and control ends to which the negative phase input signal is inputted, the number of the second plurality of differential input transistors being the same as the number of the number of the first differential input transistors;

a plurality of resistance adjusting transistors having first ends respectively connected to second ends of the plurality of first differential input transistors, second ends connected to reference potential points, and control ends to which control signals are inputted;

a plurality of wirings that connect the second ends of the plurality of first differential input transistors that constitute the differential pairs of the plurality of first differential input transistors;

a plurality of linearity improving transistors having first ends respectively connected to second ends of the plurality of second differential input transistors, second ends connected to the reference potential points, and control ends to which the control signals are inputted; and a control circuit configured to change a linearity improvement effect while controlling an operating point, by supplying the control signals to the control ends of the plurality of resistance adjusting transistors and to the control ends of the plurality of linearity improving transistors.

2. The amplifier according to claim 1, wherein the control circuit generates a control signal for causing a sum of resistance values of the resistance adjusting transistors that are turned on by the control signals and a sum of resistance values of the linearity improving transistors that are turned on by the control signals to be constant.

3. The amplifier according to claim 2, wherein the control circuit generates a control signal for causing a sum of gate widths of the resistance adjusting transistors that are turned on by the control signals and a sum of gate widths of the linearity improving transistors that are turned on by the control signals to be constant.

4. The amplifier according to claim 1, wherein the plurality of resistance adjusting transistors and the plurality of linearity improving transistors comprise a set of transistors having mutually same resistance values, and the control circuit outputs a control signal for complementarily turning on the set of transistors having the same resistance values.

5. The amplifier according to claim 1, wherein the resistance values of the plurality of resistance adjusting transistors are set to a predetermined rate, and the resistance values of the plurality of linearity improving transistors are set to be same as the resistance values of the plurality of resistance adjusting transistors.

* * * * *